(12) United States Patent
Lines (10) Patent No.: US 8,149,634 B2
(45) Date of Patent: Apr. 3, 2012

(54) LOW POWER MEMORY ARCHITECTURE

(75) Inventor: Valerie L. Lines, Ottawa (CA)

(73) Assignee: Mosaid Technologies Incorporated, Ottawa, Ontario (CA)

( * ) Notice: Subject to any disclaimer, the term of this patent is extended or adjusted under 35 U.S.C. 154(b) by 321 days.

(21) Appl. No.: 12/470,877

(22) Filed: May 22, 2009

(65) Prior Publication Data

US 2009/0231931 A1 Sep. 17, 2009

Related U.S. Application Data

(62) Division of application No. 11/363,251, filed on Feb. 28, 2006, now Pat. No. 7,555,659.

(51) Int. Cl.
*G11C 7/00* (2006.01)
(52) U.S. Cl. .............. 365/189.11; 365/203; 365/226
(58) Field of Classification Search ............. 365/189.11, 365/203, 226, 49, 189.09, 200, 206, 189.05, 365/230.03, 227, 222, 228
See application file for complete search history.

(56) References Cited

U.S. PATENT DOCUMENTS

| | | | |
|---|---|---|---|
| 5,260,904 A | 11/1993 | Miyawaki et al. | |
| 5,615,162 A | 3/1997 | Houston | |
| 5,625,592 A | 4/1997 | Shinozaki | |
| 5,805,508 A | 9/1998 | Tobita | |
| 5,926,425 A | 7/1999 | Morimoto | |
| 5,970,009 A | 10/1999 | Hoenigschmid et al. | |
| 6,101,148 A | 8/2000 | Okamura et al. | |
| 6,195,306 B1 | 2/2001 | Horiguchi et al. | |
| 6,490,221 B2 | 12/2002 | Furutani et al. | |
| 6,545,902 B2* | 4/2003 | Sakata et al. | 365/145 |
| 6,574,159 B2* | 6/2003 | Ohbayashi et al. | 365/201 |
| 6,704,237 B2 | 3/2004 | Park | |
| 6,975,147 B2* | 12/2005 | Hidaka et al. | 327/108 |
| 7,295,481 B2 | 11/2007 | Pille | |
| 2002/0149471 A1* | 10/2002 | Coppin | 340/146.2 |
| 2003/0145239 A1 | 7/2003 | Kever et al. | |
| 2005/0047196 A1* | 3/2005 | Bhavnagarwala et al. | 365/154 |
| 2007/0043965 A1 | 2/2007 | Mandelblat et al. | |

OTHER PUBLICATIONS

Taito et al., "An Embedded DRAM With a 143-MHz SRAM Interface Using a Sense-Synchronized Read/Write", IEEE Journal of Solid-State Circuits, vol. 38, No. 11, Nov. 2003, pp. 1967-1973.
Morishita et al., "A 312 MHz 16 MB Rnadom-Cycle Embedded DRAM Macro With a Power-Down Data Retention Mode for Mobile Applications", IEEE Journal of Solid-State Circuits, vol. 40, No. 1, Jan. 2005, pp. 204-212.
Hardee et al., "A 0.6 205MHz 19.5ns t RC 16 MB Embedded DRAM", International Solid-State Circuits Conference 2004, Session 11, Dram 11.1, pp. 200-209.
U.S. Appl. No. 11/363,251, Notice of Allowance dated Feb. 26, 2009.

* cited by examiner

*Primary Examiner* — Dang Nguyen
(74) *Attorney, Agent, or Firm* — Shin Hung; Borden Ladner Gervais LLP (57) ABSTRACT

A memory architecture and circuits for minimizing current leakage in the memory array. Subdivisions of the memory array each have local power grids that can be selectively connected to power supplies, such that only an accessed subdivision will receive power to execute the memory access operation. The memory array can further include databuses which are precharged to one voltage during idle times and a second voltage during active read cycles, which reduces leakage current in datapath circuitry connected to the databuses within the memory array blocks.

8 Claims, 8 Drawing Sheets

LOW POWER MEMORY ARCHITECTURE

CROSS REFERENCE TO RELATED APPLICATIONS

This application is a Divisional Application of U.S. patent application Ser. No. 11/363,251, filed Feb. 28, 2006, now issued as U.S. Pat. No. 7,555,659 on Jun. 30, 2009, the content of which is incorporated by reference in its entirety.

TECHNICAL FIELD

The present invention generally relates to memories. In particular, the present invention relates to low power circuit techniques for memories.

BACKGROUND INFORMATION

Semiconductor memories are extensively used in electronics, such as computing devices, mobile devices and other consumer devices. While some memories are used as discrete components, others are embedded with other sub-systems to help realize smaller form-factor mobile devices. For example, microprocessors, digital signal processors (DSP) and application specific integrated circuits (ASIC) have embedded memory. This memory can include volatile memories such as SRAM, DRAM, or non-volatile memories such as Flash memory, for example.

Regardless of the type of memory or how the memory is implemented in the device, an important requirement of the overall system is low power consumption. This requirement is especially important for mobile devices since users prefer to maximize the time the mobile device can be used before recharging, or replacement of the battery is required. While users can turn off the device to truly maximize power conservation, the time required to activate the device from the off state is unacceptably long. In the case of mobile phones, an off device will not receive calls or messages. Most mobile devices are fully active for a short duration of time, and spend the remaining time in a lower power consumption mode such as standby or deep power down. In such modes, the data stored in memory must be retained because the device can "wake up" relatively quickly in response to received data or user intervention. Since most mobile devices operate in the lower power consumption mode for a larger proportion of "on" time of the mobile device, power conservation should be maximized during these low power modes of operation.

Although the non-volatile memories consume little power, memory access operations are slower than SRAM and DRAM memories. Because DRAM arrays are much smaller than equivalent density SRAM, they are preferred for their high storage capacity and smaller size.

Figure 1:
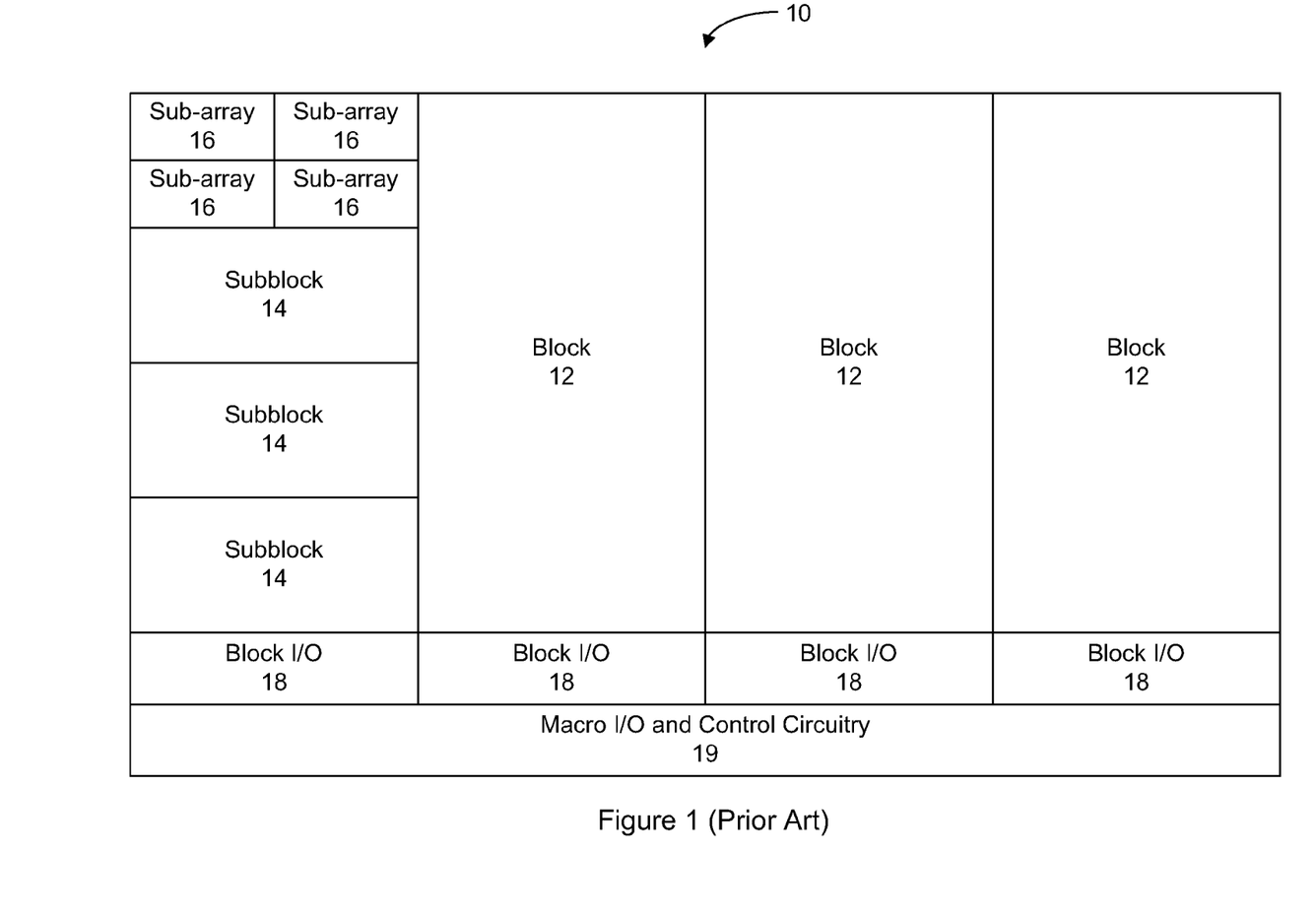
FIG. 1 is a block diagram of a memory macro.

In an embedded application, the memory system can be organized in a hierarchical level. FIG. 1 is an example of a DRAM memory macro 10 organized as four identical blocks 12. There can be any number of blocks 12 in memory macro 10. Each block 12 is further divided into four subblocks 14, and each subblock 14 is sub-divided into four sub-arrays 16. Each sub-array 16 can include memory cell array peripheral circuits, also known as core area circuits, such as wordline drivers, bitline sense amplifiers, column select devices, intermediate sense circuits, and other control circuits for writing or reading data from the memory cells of each sub-array. Power supply voltages, such as VDD and VSS, can be routed to all four blocks 12 and their respective circuits. Additional internally regulated voltages derived from VDD and VSS, can be routed to all the blocks 12. Those of skill will understand that the internally regulated voltages can be equal to, less than or greater than VDD or VSS.

Depending on the desired configuration, all n-bits of data provided by memory 10 for any single memory access operation can come from one block 12. Alternately, an equal fraction of bits (n/4) can be provided by all four blocks 12 simultaneously. Within each block 12, data can be read from one or more sub-arrays 16 of one subblock 14 via data buses (DB) (not shown), which can be sensed by data bus sense amplifiers (DBSA) within the block I/O circuit 18 local to each block 12. A macro I/O and control circuit block 19 includes input/output ports for memory macro 10, which can also contain data input and output circuitry, DRAM control and BIST circuitry. Those of skill in the art will understand that a variety of data access configurations of memory macro 10 can be implemented.

Because lower power is desired, the DRAM memory macro 10 should preferably have very low current consumption in standby and deep power down modes. Even in a low power 90 nm process, the leakage current of the transistors in the core area will contribute a significant amount of current while in the standby or deep power down modes. The current leakage problem in small geometry semiconductor circuits is well known in the semiconductor industry.

Current leakage is also a problem during an active operating mode of the memory 10. If the memory 10 of FIG. 1 was configured to provide the n-bits of data from one block 12 during an active memory access, then the remaining three unaccessed blocks can contribute a significant amount to the active current due to leakage current. In the alternate configuration where n/4-bits are provided by all four blocks 12, there can be several unaccessed subblock 14 that consume power due to leakage current.

Figure 2:
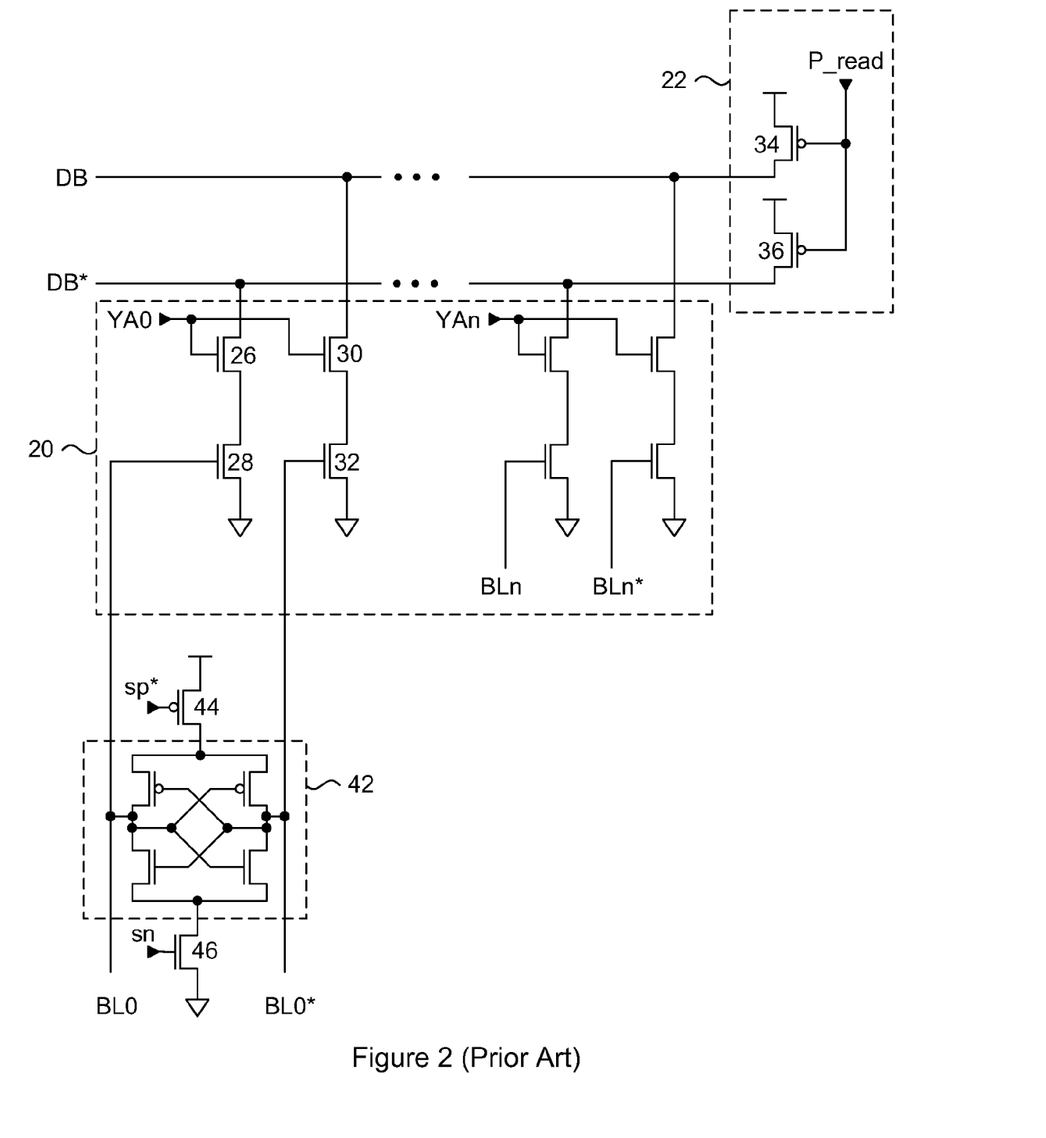
FIG. 2 is a circuit schematic of a portion of a datapath circuit of the prior art.

FIG. 2 shows one possible configuration of the bitline sense amplifier and first stage read select circuits within sub-array 16 of FIG. 1. The presently shown datapath circuit forms part of the read datapath for reading data from the sub-array 16. Write datapath circuitry is not shown or included in this discussion, but those skilled in the art will understand that such circuits are required for writing data to the memory. The shown circuit enables data on complementary bitlines BL0 and BL0* to be sensed and amplified in sense amplifier 42 and transferred to complementary data buses, DB and DB* via the read select circuit 20. BL0 and BL0* are connected to a CMOS cross-coupled bitline sense amplifier 42 that is well known in the art. VDD is provided to the p-channel devices of the bitline sense amplifier via p-channel transistor 44 controlled by signal sp*. Similarly, VSS is provided to the n-channel devices of the bitline sense amplifier via n-channel transistor 46 controlled by sn. BL0 and BL0* are also provided to the column read access circuit 20, which includes n-channel series pull down transistors 26 and 28, 30 and 32 for each bitline pair. Transistors 26 and 28 are serially connected between DB* and logic low supply voltage VSS, while transistors 30 and 32 are serially connected between DB and VSS. The gate terminals of transistors 26 and 30 receive first stage column select signal YA0, and the gate terminals of transistors 28 and 32 are connected to BL0 and BL0* respectively. This circuit is well known in the art, and has been found to be a fast circuit for placing read data on VDD precharged DB/DB* lines. Databuses DB and DB* can be bi-directional read/write databuses or uni-directional read databuses. For the purposes of the following description, DB and DB* will be uni-directional read databuses. FIG. 2 also includes databus precharge circuit 22, consisting of a pair of p-channel transistors 34 and 36 connecting VDD to DB and DB* respectively in response to precharge control signal P_read.

Figure 3:
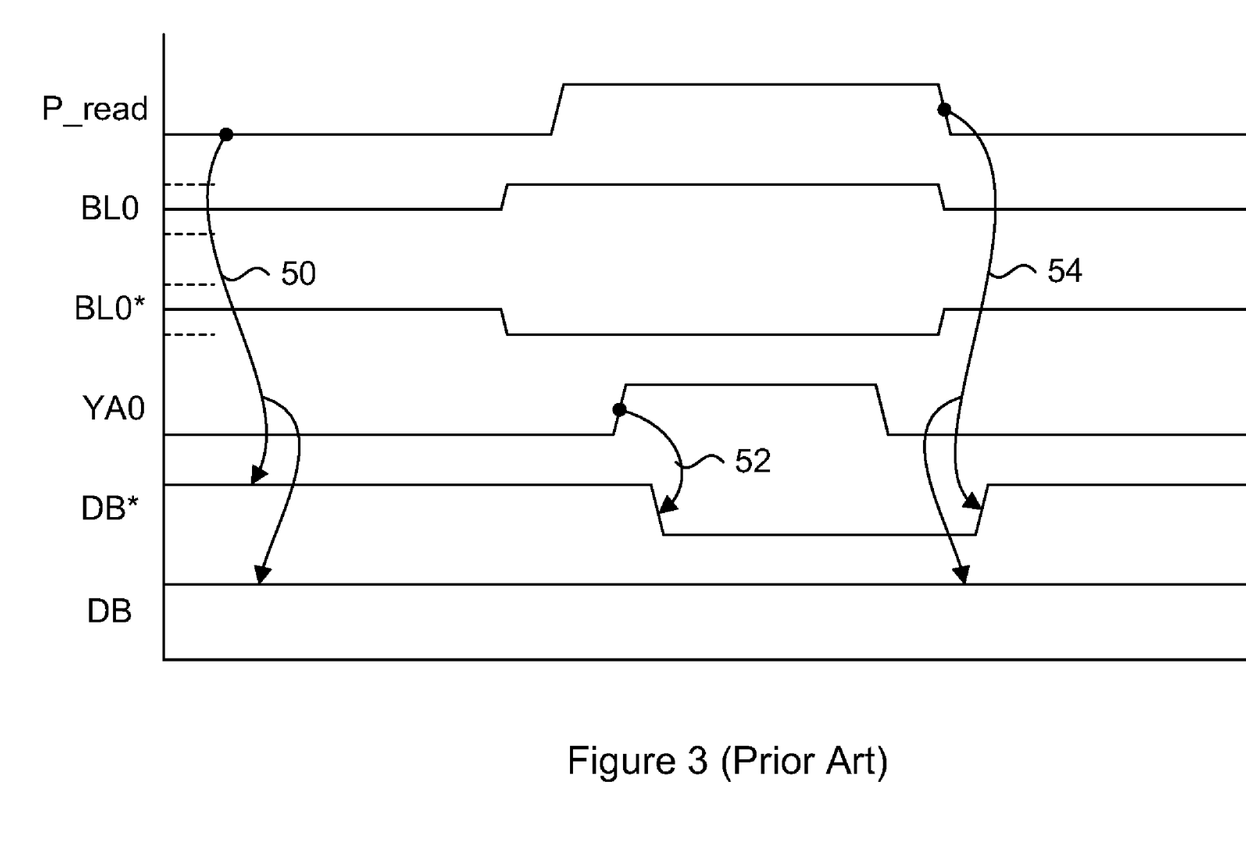
FIG. 3 is sequence diagram illustrating the operation of the datapath circuit of FIG. 2.

Operation of the circuits shown in FIG. 2 is described with reference to the sequence diagram of FIG. 3. In FIG. 3, the transition arrows indicate the logic level of a signal in response to a triggering signal. While in standby, P_read is at the low level to keep DB and DB* precharged to the high logic level, as shown by transition arrow 50. It is noted that the high and low logic levels correspond to VDD and VSS for the present discussion. During a read operation, wordlines are driven (not shown) and a voltage differential is developed on the mid-level precharged bitlines BL0 and BL0* which are then driven to complementary levels by bitline sense amplifier 42. P_read is raised to the high logic level to disable p-channel transistors 34 and 36, and YA0 is raised to the high logic level. In response to the bitline voltage levels and YA0 at the high logic level, DB* drops to the low logic level at transition arrow 52 while DB remains at the precharged high logic level. After the read cycle is completed, P_read is dropped to the low logic level, and DB and DB* are precharged back to the high logic level as shown by transition arrow 54.

One leakage path in FIG. 2 is from VDD to VSS through p-channel transistor 44, through bitline sense amplifier 42 and n-channel transistor 46. The leakage current from this path becomes more significant as deep sub-micron process geometries decrease (to 90 nm, 65 nm, and 45 nm for example), and subthreshold currents increase.

Techniques are known in the art for overcoming the leakage current problem through the bitline sense amplifier circuits. One solution can be to overdrive the gates of transistors 46 and 44 in the off state in order to minimize their current leakage. However, this solution requires more complicated bitline sense amplifier control circuitry and requires high voltage devices with thicker oxides, and larger gate lengths. The additional process cost and area cost may not be acceptable. Another solution is to lower the internal supply voltage provided to the bitline sense amplifier 42 during a power down mode of operation. However, the disadvantage of supplying the bitline sense amplifier 42 with current from an on-chip regulator is that the sense current capability may be reduced, causing slower bitline operation, even in normal operating modes.

A second current leakage path in FIG. 2 occurs between VDD and VSS through transistor 34 connected between VDD and DB and the series connected transistors 30 and 32 between DB and VSS. Similarly, there is a leakage path from VDD to VSS through transistor 36 and transistors 26 and 28. Depending on the architecture and process, this leakage path can also be significant. Experimental results from a 2 Mb embedded DRAM macro in a 90 nm process showed that the current leakage from VDD to VSS through the databus precharge devices and read y-select devices could contribute about 40 mA to the standby current. Since multiple 2 Mb DRAM macros can be implemented in a system, the total aggregate current leakage can become unacceptable.

One solution for reducing current leakage in the DB and DB* path is to connect the source terminals of transistors 28 and 32 to drain terminal of transistor 46. However, this configuration results in a slower pull-down of the read databus and requires that the current source for the transistor 46 be large enough to both drive the bitline sense amplifier and pull-down the read databus.

Thus it is desirable to develop a memory architecture and corresponding memory array core circuits which minimize leakage currents in standby and deep power-down modes, and also minimize the leakage current of portions of the memory that are not being used, such that their contribution to the active power consumption is low.

SUMMARY OF THE INVENTION

It is an object of the present invention to provide a memory architecture and circuits for minimizing current leakage in the memory array. In particular, it is an object of the invention to minimize current leakage by disconnecting the power supplies from a memory array hierarchically organized into blocks during a low power mode of operation, and then connecting the power supplies only to the block of the memory array to be accessed. Leakage current can be further reduced by a databus precharge scheme in which databuses are precharged to one voltage during idle times and a second voltage during active read cycles, such that leakage current in datapath circuitry connected to the databuses within the memory array blocks is reduced.

In a first aspect, the present invention provides a low power memory array. The low power memory array can include two or more memory subdivisions receiving a global power supply voltage, a local power grid in each of the two or more memory subdivisions, and a power gating circuit in each of the two or more memory subdivisions. The local power grid in each of the two or more memory subdivisions selectively distributes the global power voltage. The power gating circuit in each of the two or more memory subdivisions selectively connects the global power voltage to the corresponding local power grid of one of the two or more memory subdivisions.

According to an embodiment of the present aspect, each of the two or more memory subdivisions can include datapath circuitry connected to the local power grid, where the datapath circuitry can include bitline sense amplifiers and databus sense amplifiers. The power gating circuit can selectively connect the global power voltage to the corresponding local power grid of one of the two or more memory subdivisions in response to at least one of a decoded address signal and a control signal.

In another embodiment, the global power voltage can include a logic high global power supply voltage and a logic low global power supply voltage. In such an embodiment, the local power grid can include a first local power grid for distributing the logic high global power supply voltage, and a second local power grid for distributing the logic low global power supply voltage. The power gating circuit can include a first power switch transistor connected between the logic high global power supply voltage and the first local power grid, and a second power switch transistor connected between the logic low global power supply voltage and the second local power grid.

In a second aspect, the present invention provides a method for low power operation of a memory array, where the memory array is arranged in subdivisions that each have local power grids. The method includes the steps of receiving a memory access command for accessing at least one of the subdivisions; and, connecting a global power supply voltage to the local power grid of the at least one subdivision to be accessed.

According to embodiments of the present aspect, the step of connecting can include activating a power switch transistor for connecting the global power supply voltage to the local power grid, and the method can further include executing the memory access command in the at least one subdivision after the step of connecting. The global power supply voltage can be disconnected from the local power grid of the at least one subdivision after the step of executing.

In another embodiment of the present aspect, the global power supply voltage can include logic high and a logic low supply voltages and the local power grid can include logic high and logic low local power grids. The step of connecting can include activating a power switch transistor for connecting the logic high supply voltage to the local logic high power grid and for connecting the logic low supply voltage to the local low power grid.

In a third aspect, the present invention provides a datapath circuit. The datapath circuit can include a databus, a precharge circuit, and a plurality of data transfer circuits. The precharge circuit selectively precharges the databus to a first voltage during an idle period and a second voltage in an active period. The plurality of data transfer circuits are each selectable for connecting the databus to the first voltage in response to data in the active period.

In embodiments of the present aspect, the precharge circuit can include a pull-up circuit for precharging the databus to the second voltage in the active period, and a pull-down circuit for precharging the databus to the first voltage during the idle period.

In yet further embodiments of the present aspect, the databus can include true and complementary datalines, the pull-up circuit can include a first pull-up transistor pair for connecting the true dataline and the complementary dataline to the second voltage, and the pull-down circuit can include a pull-down transistor pair for connecting the true dataline and the complementary dataline to the first voltage.

In a fourth aspect, the present invention provides a method for low power datapath operation. The method can include the steps of precharging a databus pair, driving one of the databus pair, and precharging the databus pair. The databus pair can be precharged from a first voltage to a second voltage in an active period. The databus pair can be driven to the first voltage in response to data during the active period. The databus pair can be precharged to the first voltage in an idle period after the active period has ended.

In an embodiment of the present aspect, the step of precharging the databus pair to the second voltage can include disabling pull-down down transistors coupled between the databus pair and the first voltage, before enabling pull-up transistors coupled between the databus pair and the second voltage. The step of precharging the databus pair to the first voltage can include disabling the pull-up transistors before enabling the pull-down transistors.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

A memory architecture and circuits for minimizing current leakage in the memory array is disclosed. Subdivisions of the memory array each have local power grids that can be selectively connected to global power supply voltages, such that only an accessed subdivision will receive power to execute a requested memory access operation.

Figure 4:
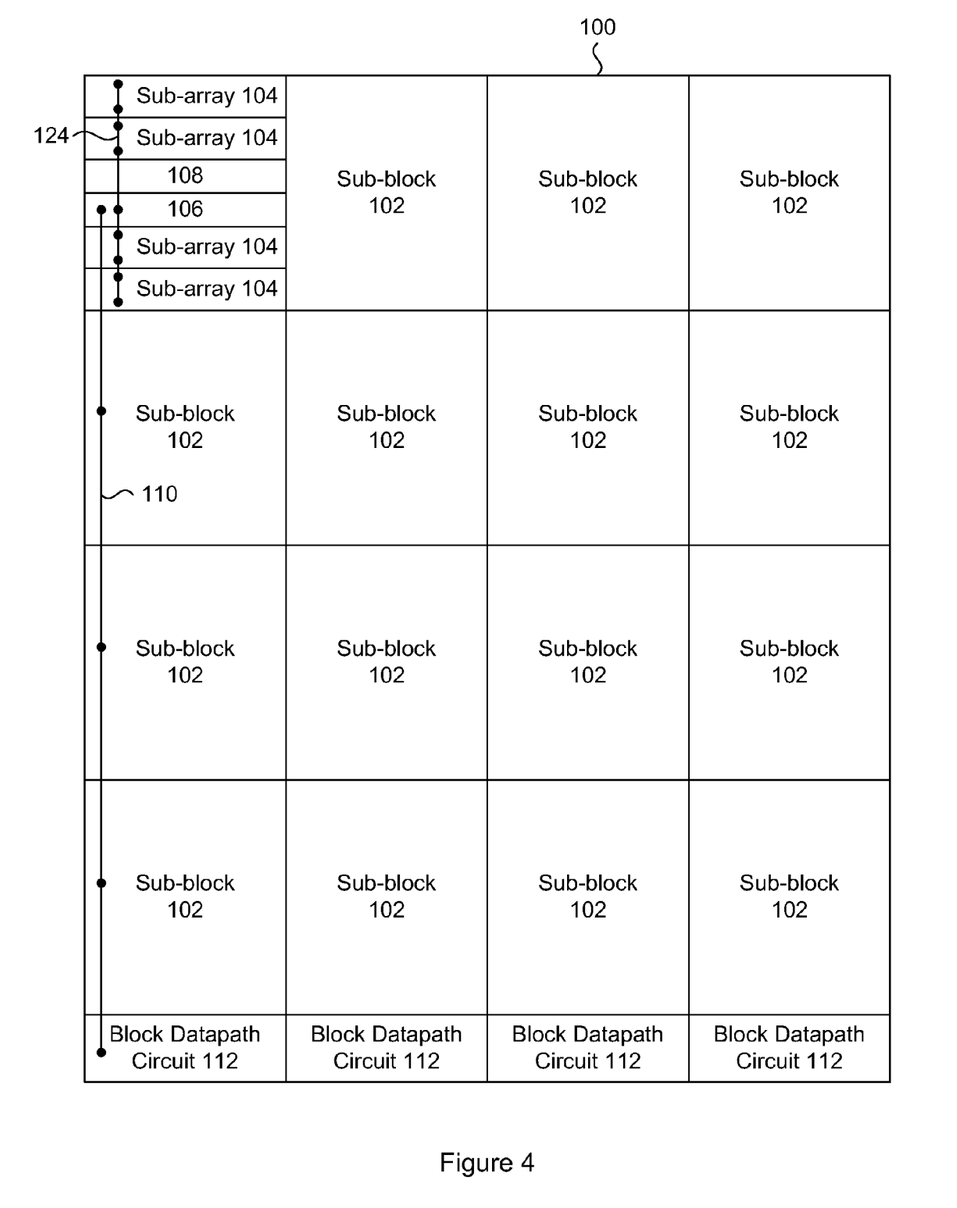
FIG. 4 is a schematic of a memory block according to an embodiment of the present invention.

FIG. 4 is a diagram of a memory block implemented with a power distribution scheme according to an embodiment of the present invention. The memory block 100 can be one of several blocks in a memory system, and is composed of a number of subblocks, each labeled 102. Each subblock 102 includes four subarrays, labeled 104, local subblock datapath circuitry 106 and local power gating circuitry 108 for the subblock. As should be appreciated by a person skilled in the art, the memory block 100 can be organized to have a different number and/or organization of subblocks, and each subblock 102 can be organized to have a different number of subbarrays.

FIG. 4 also highlights a portion of the datapath. It should be understood from this point forward that datapath circuits can include read/write circuits, bitline sense amplifiers, databus sense amplifiers, and bitline and databus precharge circuits. Each subblock contains local databus pairs LDB and LDB* 124, which is shown in further detail in FIG. 5. Higher level databuses, labeled block level databus pairs DB and DB* 110, extend vertically through a strip of subblocks 102, and are connected to the local subblock datapath circuitry 106 of each subblock 102. The block level databus pair DB and DB* 110 are connected to a block datapath circuit 112 for the strip of subbblocks 102. The block datapath circuit 112 can include sense amplifier circuits and/or transfer circuits for coupling data from the higher level databus pair DB and DB* 110 to the system.

Figure 5:
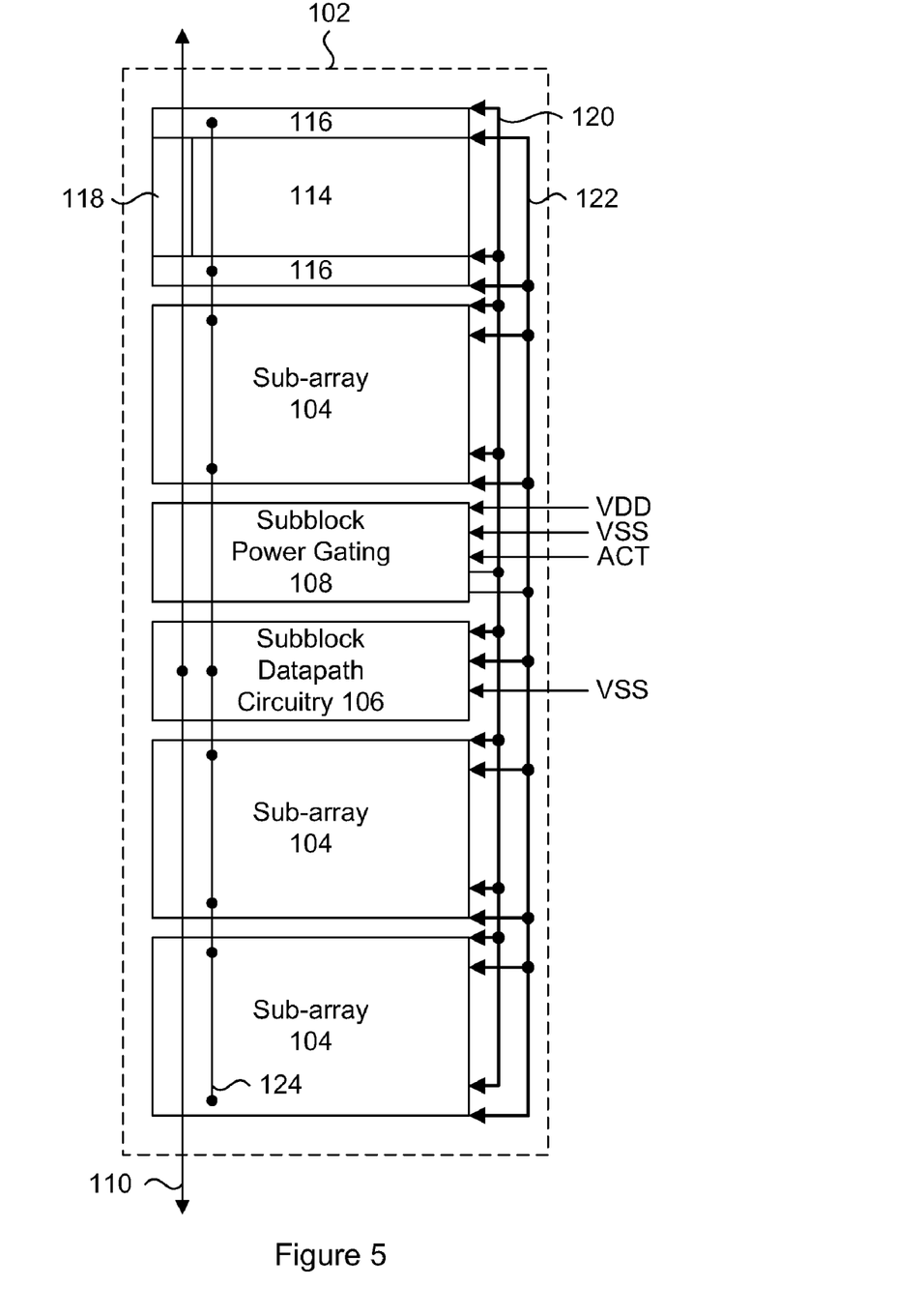
FIG. 5 is a schematic of a subblock shown in the memory block of FIG. 4.

FIG. 5 is a diagram of the subblock 102 of FIG. 4, which includes four subarrays 104, and a local subblock datapath circuit 106. Each sub-array 104 includes memory cell array 114 and memory core circuits such as bitline sense amplifier and column select circuits 116, and wordline driver circuits 118. As shown in FIG. 5, block level databus pair DB and DB* 110 extend vertically through subblock 102, and are connected to local subblock datapath circuit 106. Block level databus pair DB and DB* 110 receives data from local databus pairs LDB and LDB* 124 which also extend vertically within subblock 102, via local subblock datapath circuitry 106. While only one pair of busses 110 and 124 are shown in FIG. 5, there can be any number of local databus pairs LDB and LDB* 124 that can be selectively coupled to one of a number of higher level databus pairs DB and DB* 110. The block level databus pair 110 can be a bi-directional bus pair or a uni-directional bus pair. In the following description it is assumed to be a unidirectional read databus pair. The write databus pair is not described here.

Subblock 102 has a local power grid consisting of a local power grid 120 for distributing vddl and a local power grid 122 for distributing vssl to the circuits within subblock 102. Both grids 120 and 122 can be selectively connected to global power supply voltages VDD and VSS through local power gating circuit 108. Preferably, the local power grids 120 and 122 are connected to the bitline sense amplifier and column select circuits 116, and to the local subblock datapath circuitry 106. Other circuits in the block which can receive vddl and vssl are not shown to simplify the schematic, but those of skill in the art will understand that such circuits may be required to enable proper functionality of the subblock 102. Local power gating circuit 108 can selectively connect VDD and VSS to their respective local power grids 120 and 122, in response to a selection signal ACT. Preferably, ACT can be a control signal logically derived from an address, or in combination with an address and one or more enable signals. Therefore, exactly one or more subblocks 102 of memory block 100 can be connected to VDD and VSS, or any internally regulated power supply voltage globally distributed across memory block 100.

Figure 6:
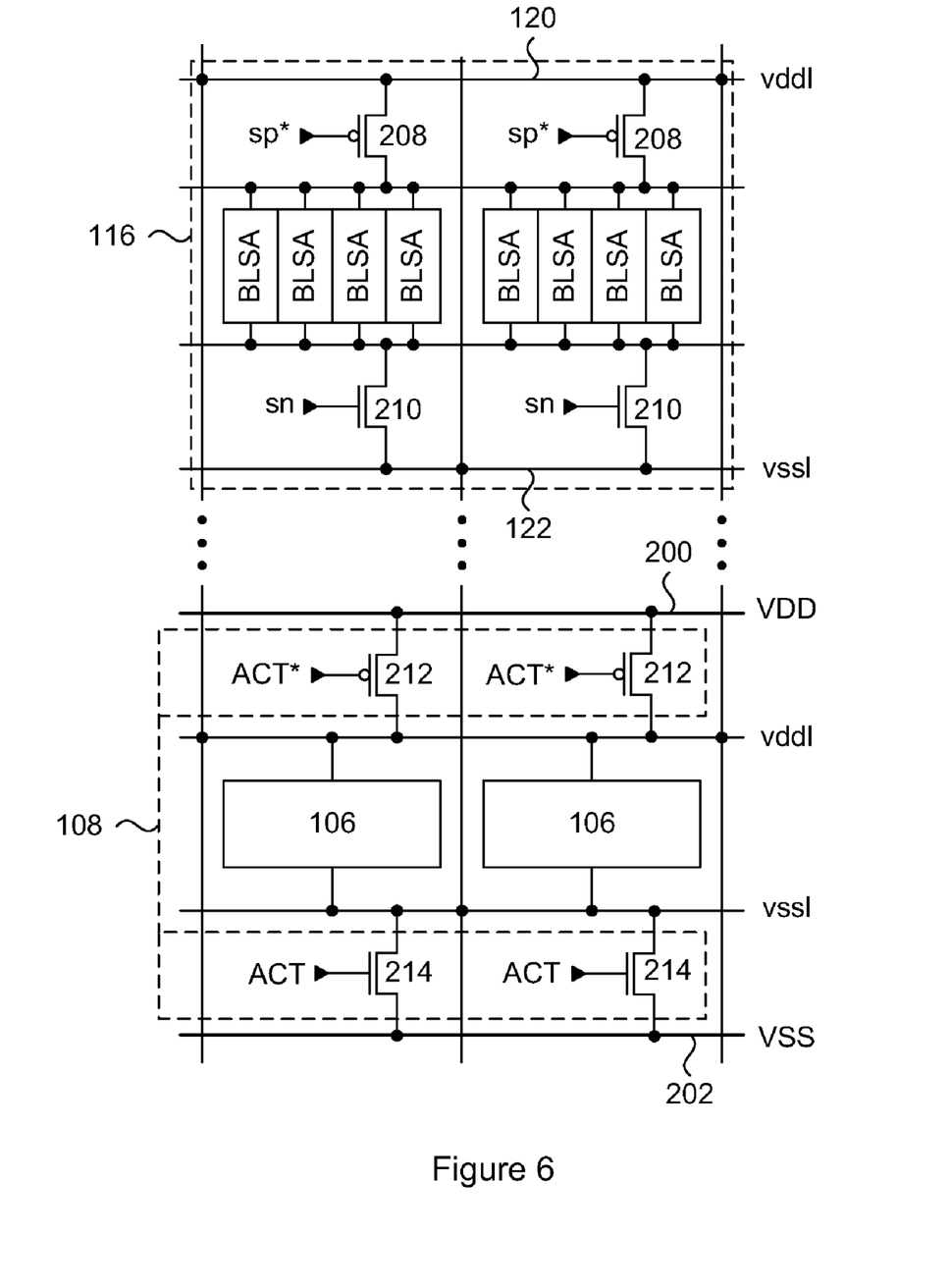
FIG. 6 is a schematic showing the local power grid distribution within the memory subblock shown in FIG. 5.

FIG. 6 is a schematic further illustrating the distribution of the local grids 120 and 122 within subblock 102 according to an embodiment of the present invention. As previously illustrated in FIGS. 4 and 5, subblock 102 comprises of sub-arrays 104 where each sub-array includes bitline sense amplifier and column select circuits 116. FIG. 6 shows datapath circuits which include a portion of one bitline sense amplifier and column select circuit 116 for one sub-array 104, a portion of local subblock datapath circuit 106, and a portion of local power gating circuit 108. VDD power supply line 200 and VSS power supply line 202 distribute power supply voltages VDD and VSS respectively, to all blocks in the memory. Unique to subblock 102 are the local vddl and vssl power grids 120 and 122, which distribute local logic high supply voltage vddl and local logic low supply voltage vssl to one or more circuits in subblock 102, such as bitline sense amplifier and column select circuits 116.

Bitline sense amplifier and column select circuit 116 is shown in FIG. 6 as including bitline sense amplifiers (BLSA) connected to receive vddl and vssl through switch transistors 208 and 210 controlled by signals sp* and sn. The column select portion of the circuit is not included for schematic simplicity. The circuit arrangement and operation of circuit 116 is well known in the art. The vddl and vssl local power grids can be selectively disconnected, or stated alternatively, selectively connected to global power supply lines 200 and 202 through local power gating circuit 108. Local power gating circuit 108 comprises one or more p-channel power switch transistors 212 controlled by signal ACT*, and one or more n-channel power switch transistors 214 controlled by complementary signal ACT.

While two pairs of power switch transistors 212 and 214 are shown, any number of power switch transistors can be distributed in parallel within subblock 102, as should be understood by any person skilled in the art. The total size of power switch transistors 212 and 214 (a single transistor or collective size of multiple transistors) is preferably large enough to supply bitline restore current for the maximum number of sub-arrays 104 that are enabled at any one time, and the local datapath circuits 106. For example, if only one sub-array 104 is enabled in subblock 102, then the power switch transistors can be sized to be smaller than if two sub-arrays 104 are enabled at the same time.

The operation of local power gating circuit 108 is as follows, according to an embodiment of the invention. It is assumed for the present discussion that during an active read, write or refresh cycle, one subblock 102 of memory block 100 is enabled.

The default operating mode of memory 10 is the standby mode. Accordingly, the local power gating circuits 108 of all subblocks 102 are turned off to disconnect the global VDD and VSS lines from their corresponding local power grids 120 and 122 within each subblock 102. The address corresponding to a read, write or refresh cycle can be decoded to provide one active subblock address used to drive complementary control signals ACT/ACT* within that subblock to their active levels. In the presently shown example, ACT is driven to the high logic level and ACT* is driven to the low logic level to turn on power switch transistors 212 and 214 of local power gating circuit 108 of the one selected subblock. Thus, VDD and VSS power is connected to the local power grids 120 and 122 to provide power to all the sub-arrays 104 of selected subblock 102. The remaining unselected subblocks 102 do not have their complementary control signals ACT/ACT* driven to the active levels, hence keeping VDD and VSS disconnected from their respective local vddl and vssl power grids.

Those of skill in the art will understand that power should be provided to the selected subblock 102 in advance of other control or activation signals for executing the memory access cycle (read, write or refresh) for the selected subblock 102. Those of skill in the art will understand that address decoding can be implemented in a look-ahead scheme to quickly activate ACT/ACT* for the selected subblock 102 before the other address and/or control signals are provided to the sub-arrays 104. Look ahead schemes are known in the art, and can include adding the appropriate delays in the signal paths to ensure that ACT/ACT* for the selected block 102 is activated first.

Since non-selected subblocks will not have VDD and VSS power provided to their respective vddl and vssl local power grids, leakage current in the non-selected blocks can therefore be minimized. Although leakage current can be minimized by disconnecting both VDD and VSS from the local power grids, leakage current can also be reduced by disconnecting only VDD from the local power grids.

Therefore, by connecting power only to one or more selected subdivisions of a memory, overall leakage current of the memory can be reduced. The aforementioned embodiments of the power distribution scheme illustrate the coupling of global VDD and VSS to the local power grids of a particular subdivision of the memory, which in turn provide the VDD and VSS power to specific circuits. The previously discussed embodiments of the invention are not limited to systems using only VDD and VSS power supplies. Some memory systems may require reduced internal voltages in addition to VDD or instead of VDD. Therefore any number of local power grids can be formed in the memory subdivision to provide the necessary voltage supplies to the various circuits that require them. Of course, there may be circuits in the subdivisions that are not connected to the local power grids, and directly receive the global power supply voltages.

One such circuit that may receive the global power supply voltage directly is the subbock datapath circuit 106 of FIG. 5. Accordingly, leakage current could persist even in unaccessed blocks. However, datapath circuitry can be implemented such that this leakage current in datapath circuit 106 is reduced, as described below.

Figure 7:
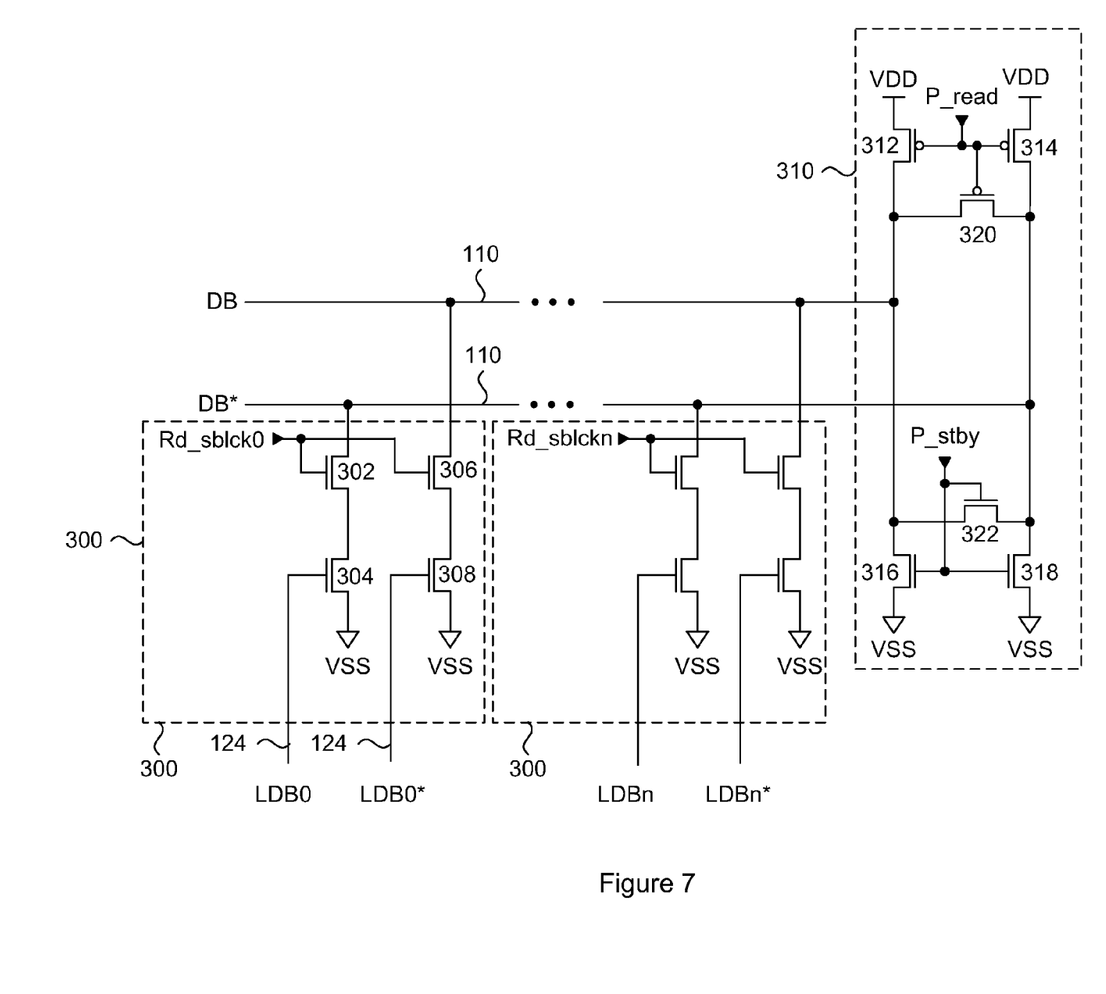
FIG. 7 is a circuit schematic of a datapath circuit according to an embodiment of the present invention; and, FIG. 8 is a sequence diagram illustrating the operation of the datapath circuit of FIG. 7.

FIG. 7 shows transfer circuits 300 within respective local datapath circuits 106 of at least two subblocks 102 used to transfer the read data from the local LDB,LDB* databus pair 124 corresponding to each subblock 102 to the block level DB,DB* databus pair 110. FIG. 7 also shows the DB,DB* precharge circuit 310 located in the block datapath circuit 112 of FIG. 4. For the configuration of memory block 100 shown in FIG. 4, DB,DB* databus pair 110 are connected to four transfer circuits 300 from the subblocks 102 of the same logical block (vertical strip of subblocks 102). Transfer circuit 300 includes transistors 302 and 304 between DB* and VSS as well as transistors 306 and 308 between DB and VSS. A read control signal for one subblock, rd_subblk0 is used to control the gates of transistors 302 and 306. LDB0 is connected to the gate of transistor 304 and LDB0* is connected to the gate of transistor 308. In FIG. 7, the last transfer circuit 300 connects LDBn/LDBn* to DB,DB* via signal rd_sub-blkn, where "n" can be any integer number, such as 3 for the presently described example. Although vssl is supplied to the local subblock datapath circuitry 106, it is preferably not used in circuit 300. The load of the DB and DB* buses is such that replacing the VSS connection in circuit 300 with vssl can cause the operation of the bitline sense amplifiers to be slowed more than is acceptable. However, vssl can be used in applications where speed is not critical. The DB/DB* precharge circuit 310 includes transistors 312 and 314 connected between VDD and DB/DB*. It is noted that in some memory designs data on BL and BL* from the memory cell array 114 can be transferred to the local LDB,LDB* databus pair 124 using similar circuitry to that described here Thus a leakage path exists similar to that described in FIG. 2. The control of the precharge devices 312 and 314 is modified relative to the prior art scheme where the databuses are precharged to VDD only, and transistor 316 connected between DB and VSS and transistor 318 connected between DB* and VSS are included to reduce that leakage path. An alternate embodiment can have transistors 312 and 314 connected to a local vddl instead of to VDD. Pull-down transistors 316 and 318 have their gate terminals connected to control signal P_stby for connecting DB and DB* to VSS. An optional p-channel equalizing transistor 320 connected between DB and DB* and controlled by P_read can be included. Similarly, an optional n-channel equalizing transistor 322 connected between DB and DB* and controlled by P_stby can be included.

The datapath circuit in FIG. 7 will only precharge DB and DB* to a logic high supply voltage, such as vddl or VDD, in an active period in preparation for a read operation within the vertical strip which includes the subblock being accessed. In all other vertical strips of subblocks in which all subblocks are non-accessed or in datapath circuits that are idle, DB and DB* remain precharged to the logic low supply voltage. An idle period implies that the datapath circuit will not be used for memory access operations. By example, refresh operations do not require the use of DB and DB*, hence the circuit effectively remains idle even though wordlines and bitline sense amplifiers are active.

Control signals P_read and P_stby can be derived from address signals, such as a subblock address, and access control signals and/or power mode control signals, to preferably provide non-overlapping activation and de-activation of their respective transistors. A preferred mode of operation of precharge circuit 310 is described with reference to the sequence diagram of FIG. 8.

Figure 8:
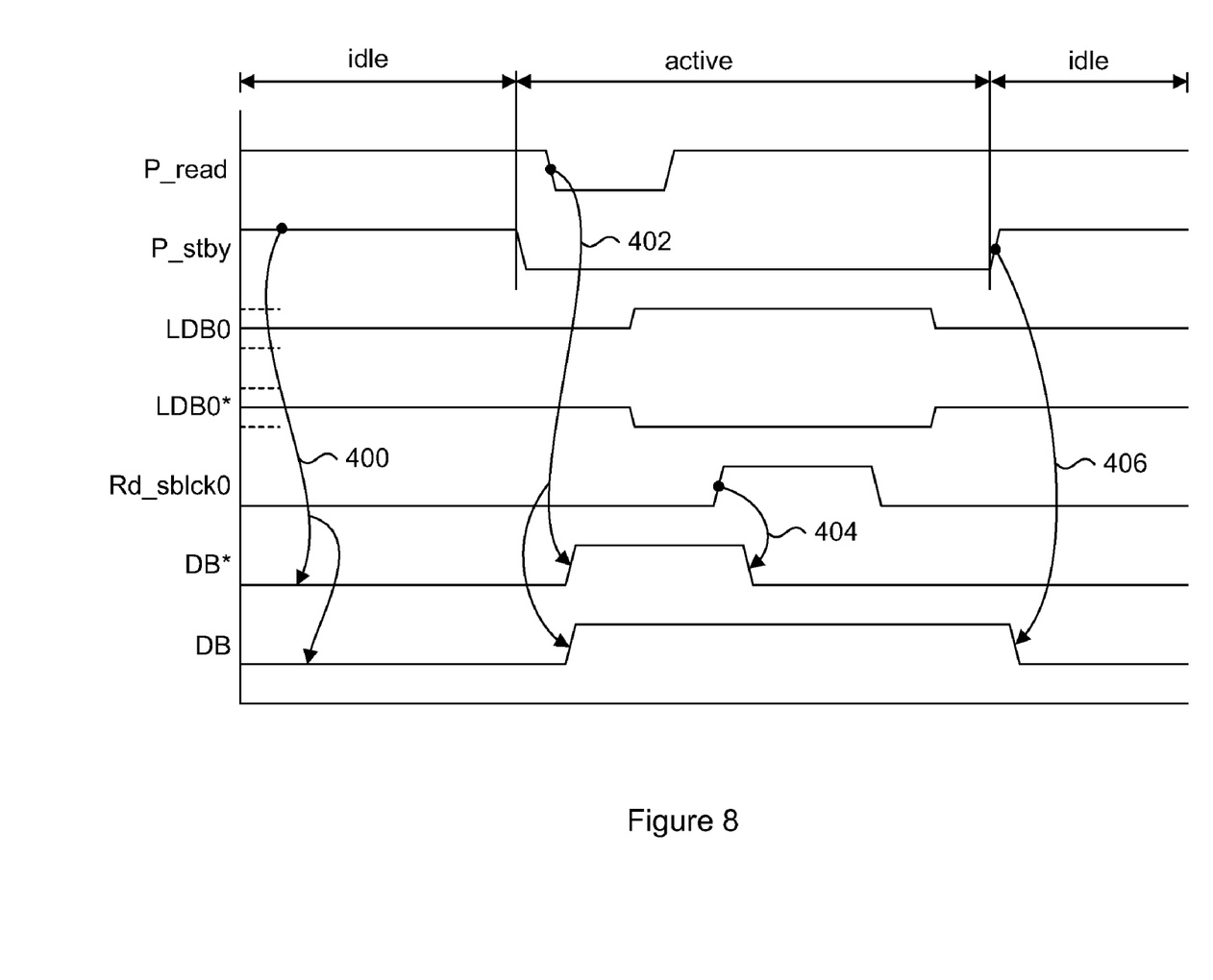

In FIG. 8, it is assumed that one memory subblock 102 and one block datapath circuit 112 are selected for a single memory read operation, and that LDB0 and LDB0* have been driven to the logic high and low levels respectively. As in FIG. 3, the transition arrows indicate the logic level of a signal in response to a triggering signal. In the selected block, all the circuits 310 start in the default low power mode of operation where P_read and P_stby are set to the high logic level. Therefore, transistors 312, 314 and 320 are turned off and transistors 316, 318 and 322 are turned on to keep DB and DB* at the low logic level, as shown by transition arrow 400. Accordingly, the precharge circuit 310 is operating in an idle period. For a selected block datapath circuit 112 which is enabled to respond to a memory access operation, the respective P_stby signal drops to the low logic level to turn off transistors 316, 318 and 322, disconnecting DB and DB* from the low logic level. This disconnection of DB and DB* ends the idle period and starts the active period for the precharge circuit 310. Shortly after at transition arrow 402, P_read for the selected block datapath circuit drops to the low logic level to turn on transistors 312, 314 and 320 to drive DB and DB* to the high logic level in preparation for a read operation. It is noted that the high logic level corresponds to the logic high supply voltage while the low logic level corresponds to the logic low supply voltage.

Preferably, DB and DB* are precharged to the high logic level while other memory access functions, such as wordline activation and bitline sensing, are being executed. When reading data with a logic '1' value (logic high), local databus pair LDB0 and LDB0, are driven from their precharged state (shown in this example to be VDD/2) to the high and low logic levels respectively. Read data can be placed on LDB0 and LDB0* at any time before Rd_sblck0 rises to the high logic level. P_read will rise to the high logic level to turn off transistors 312, 314 and 320 and release DB and DB* from VDD (or vddl). At transition arrow 404, the select signal Rd_sblck0 will be driven to the high logic level for an amount of time sufficient for discharging one of DB and DB* to VSS. When Rd_sblck0 is at the high logic level, DB* is connected to the low logic level of VSS and DB remains at the precharged high logic level of VDD (or vddl).

At some predetermined time, after Rd_sblck0 is low, P_stby will rise to the high logic level at transition arrow 406 to turn on pull-down transistors 316, 318 and transistor 322, causing DB and DB* to be precharged to VSS. LDB0 and LDB0* can be precharged at any time after Rd_sblck0 falls to the low logic level. The rise of P_stby ends the active period and starts another idle period of operation since it is presumed that DB and DB* will not immediately be used again for memory access operations. The relative activation and deactivation sequence of signals P_stby, P_read and Rd_sblck0 are easily regulated by logic control circuits operating asynchronously or synchronously with the system clock. Preferably, P_read and P_stby are controlled such that there is no overlapping time when the pull-up and pull-down transistors are on at the same time.

The precharge circuit 310 can be controlled to precharge DB and DB* back to VDD (or vddl) instead of to VSS after Rd_sblck0 drops back to the low logic level. This can be done for memory accesses in which any memory subblocks connected to DB and DB* will be accessed every few clock cycles, to prevent unnecessary toggling of both DB and DB* from VSS to VDD (or vddl).

In an alternate embodiment, the control of the precharge devices 312 and 314 is modified as described above, and transistors 316,318 and 322 are not included. In this embodiment, the DB and DB* lines will float at a level determined by the relative leakage of devices 312 and 314 and the pull-down devices in circuit 300.

Those of skill in the art will appreciate that the databus precharge circuit 310 can be controlled to maximize speed and/or low current leakage for any type of read operation through the logical combination of available control signals. While the presently described embodiment has been described with reference to DB and DB* as uni-directional read databuses, the dual voltage precharge scheme can also apply to uni-directional write databuses or bi-directional read/write databuses.

The previously described power distribution scheme and databus precharge circuit embodiments can be used independently of each other to reduce leakage current in the memory array. Current leakage can be further reduced if the schemes are combined with each other.

While the presently described embodiments show local power grids applied to memory subdivisions such as sub-blocks 102, those skilled in the art will understand that each local power grid can be implemented within a grouping of subblocks or a further subdivision of a subblock. Furthermore, more than one subdivision can be accessed during any single memory access operation.

In the embodiments described above, the device elements and circuits are connected to each other as shown in the figures, for the sake of simplicity. In practical applications of the present invention to DRAM devices and semiconductor ICs, circuits, elements, devices, etc. may be connected directly to each other. As well, circuits, elements, devices, etc. may be connected indirectly to each other through other circuits, elements, devices, etc., necessary for operation of the DRAM devices and semiconductor ICs. Thus, in actual configuration of DRAM devices and semiconductor ICs, the circuit, elements, devices, etc. are coupled with (directly or indirectly connected to) each other.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A datapath circuit comprising:
   a databus;
   a precharge circuit for selectively precharging the databus to a first voltage during an idle period and a second voltage in an active period; and,
   a plurality of data transfer circuits each selectable for connecting the databus to the first voltage in response to data in the active period.

2. The datapath circuit of claim 1, wherein the precharge circuit includes
   a pull-up circuit for precharging the databus to the second voltage in the active period, and,
   a pull-down circuit for precharging the databus to the first voltage during the idle period.

3. The datapath circuit of claim 1, wherein the databus includes true and complementary datalines.

4. The datapath circuit of claim 3, wherein the pull-up circuit includes a first pull-up transistor pair for connecting the true dataline and the complementary dataline to the second voltage.

5. The datapath circuit of claim 4, wherein the pull-down circuit includes a pull-down transistor pair for connecting the true dataline and the complementary dataline to the first voltage.

6. A method for low power datapath operation comprising:
   a) precharging a databus pair from a first voltage to a second voltage in an active period;
   b) driving one of the databus pair to the first voltage in response to data during the active period; and,
   c) precharging the databus pair to the first voltage in an idle period after the active period has ended.

7. The method of claim 6, wherein the step of precharging the databus pair to the second voltage includes disabling pull-down down transistors coupled between the databus pair and the first voltage, before enabling pull-up transistors coupled between the databus pair and the second voltage.

8. The method of claim 7, wherein the step of precharging the databus pair to the first voltage includes disabling the pull-up transistors before enabling the pull-down transistors.

* * * * *